United States Patent [19]
Yamamoto et al.

[11] Patent Number: 5,990,741
[45] Date of Patent: Nov. 23, 1999

[54] VARIABLE GAIN AMPLIFIER

[75] Inventors: Takeshi Yamamoto; Yoshitaka Kasagi, both of Yokohama, Japan

[73] Assignee: Kabushiki Kaisha Toshiba, Kawasaki, Japan

[21] Appl. No.: 09/064,831

[22] Filed: Apr. 23, 1998

[30] Foreign Application Priority Data

Apr. 25, 1997 [JP] Japan ..................................... 9-109456

[51] Int. Cl.⁶ ...................................................... H03F 3/45
[52] U.S. Cl. ............................................ 330/253; 330/254
[58] Field of Search ..................................... 330/254, 261, 330/253, 257

[56] References Cited

U.S. PATENT DOCUMENTS

| | | | |
|---|---|---|---|
| 4,320,347 | 3/1982 | Haque | 330/9 |
| 4,335,355 | 6/1982 | Haque | 330/253 |
| 4,871,978 | 10/1989 | Galbraith | 330/253 |
| 5,068,622 | 11/1991 | Mead et al. | 330/253 |
| 5,334,949 | 8/1994 | Sone | 330/253 |
| 5,600,280 | 2/1997 | Zhang | 331/57 |

OTHER PUBLICATIONS

IEEE Transactions on Circuits and Systems–I: Fundamental Theory and Applications., vol.,42, No. 11,Nov.1995 Low–Voltage Analog IC Design In CMOS Technology, pp. 955–958, A.L. Coban et al.

IEEE Transactions on Circuits and Systems–I: Fundamental Theory and Applications, vol. 42, No. 8, Aug. 1995, An MOS Four–Quadrant Analog Multiplier Based on the Multitail Technique Using a Quadrital Cell as a Multiplier Core, K.Kimura, pp. 448–454.

*Primary Examiner*—Benny T. Lee
*Assistant Examiner*—Henry Choe
*Attorney, Agent, or Firm*—Pillsbury Madison & Sutro LLP

[57] ABSTRACT

A variable gain amplifier is disclosed, comprising a pair of differential MOS transistors M1 and M2 and a current mirror. The sources of the differential MOS transistors M1 and M2 are connected to a constant voltage terminal. Since a DC voltage Vc is added to input signals, output signals that are theoretically free of a distortion are obtained. The gain can be controlled from infinitesimal. Since the gain is directly proportional to the control voltage, it can be easily controlled. Since a single output current is free of a distortion, even if amplifiers are connected on many stages, an output signal that is free of a distortion can be obtained.

8 Claims, 5 Drawing Sheets

PRIOR ART

FIG. 9

VARIABLE GAIN AMPLIFIER

BACKGROUND OF THE INVENTION

1. Field of the Invention

The present invention relates to a variable gain amplifying circuit for processing an analog signal in a MOS type semiconductor integrated circuit.

2. Description of the Related Art

In recent years, as digital units have been widely used and digital signal processing technologies have been advanced, CMOS type integrated circuits suitable for processing digital signals have shared most part of integrated circuits in the semiconductor market.

However, since video signals and audio signals are inputted and outputted as analog signals, they can be easily processed as analog signals. When such signals are processed as digital signals, analog circuits are required for an A/D converter, a D/A converter, filters, an oscillator for a clock signal, and so forth.

A bipolar type integrated circuit is suitable for an analog circuit. A CMOS type integrated circuit is not suitable for an analog circuit except for part of circuits such as an analog switch and a sample hold circuit. However, the fabrication process for a bipolar type integrated circuit and a Bi-CMOS type integrated circuit is relatively expensive. In addition, it is desired to structure one chip CMOS type integrated circuit that has both a digital circuit and an analog circuit. Thus, CMOS type integrated circuits that process analog signals have been intensively developed.

A circuit that is frequently used and that largely affects the performance of a final product is a "variable gain amplifier". As a bipolar type integrated circuit, a hybrid transistor circuit named "gain cell" has been used. When a variable gain amplifier is structured with such a "gain cell", a circuit that has a gain proportional to the ratio of two bias currents can be easily accomplished.

Figure 9:
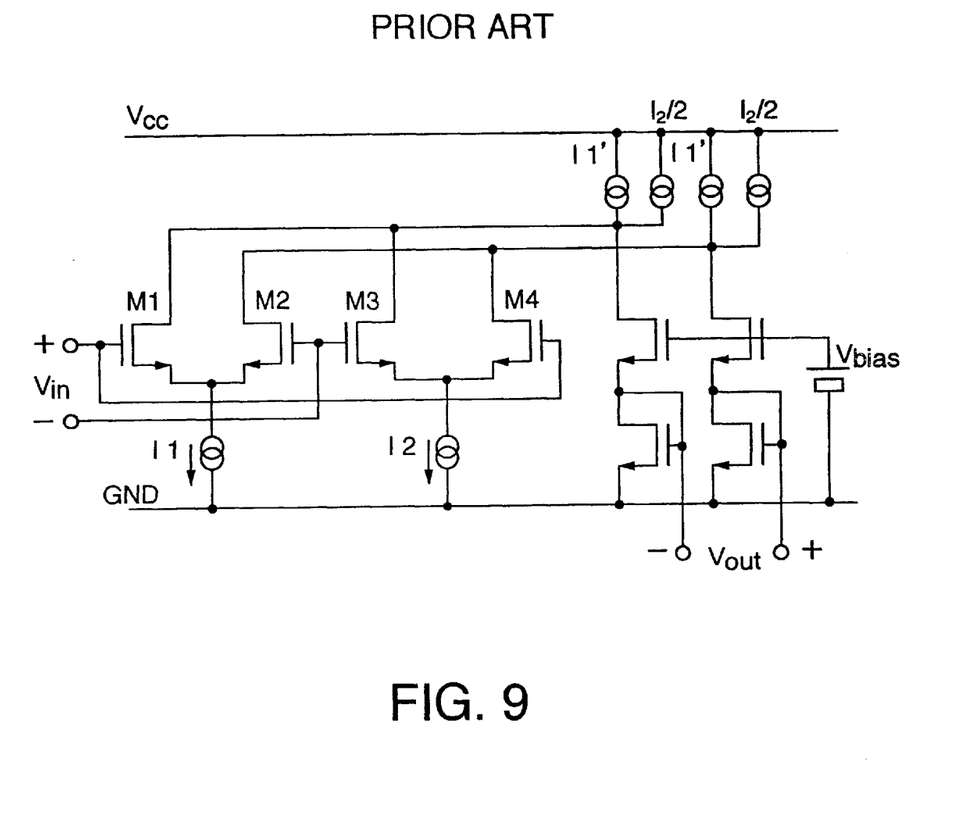
FIG. 9 is a circuit diagram for explaining a conventional variable gain amplifier.

When a variable gain amplifier is structured with a CMOS type integrated circuit, if the bipolar type integrated circuit is substituted with a CMOS type integrated circuit or a modification circuit, a large secondary distortion always takes place. FIG. 9 shows the structure of a variable gain differential amplifier composed of a CMOS type integrated circuit that is disclosed in Japanese Patent Laid-Open Application No. 8-298416. Next, with reference to the CMOS type variable gain differential amplifier, problems of the conventional circuit will be described.

The circuit shown in FIG. 9 comprises a first differential transistor circuit and a second differential transistor circuit. The first differential transistor circuit is composed of MOS transistors M1 and M2 and a current source I1. Likewise, the second differential transistor circuit is composed of MOS transistors M3 and M4 and a current source I2. In each of the first differential transistor circuit and the second differential transistor circuit, a pair of source coupled transistors are biased with a current source. Next, the first differential transistor circuit composed of the MOS transistors M1 and M2 and the current source I1 will be described. However, for simplicity, it is assumed that input signals are fully-differential signals, both the transistors operate in a saturation region (pinch-off region) and that a short channel effect is not considered.

At this point, the characteristic of each MOS transistor can be represented with a principal parameter $k$ and a threshold voltage $V_{th}$ as follows.

$$I = (k/2)(V_{GS} - V_{th})^2$$

where $k$ is a constant represented by $\mu C_{ox} W/L$ (W represents the gate width; L represents the gate length; $C_{ox}$ represents the gate capacitance; $\mu$ represents the carrier mobility of channel). With the formula, the operations of the MOS transistors M1 and M2 are expressed as follows.

$$M1: I11 = (k/2)(V_{GS1} - V_{th})^2 \qquad (1)$$

$$M2: I12 = (k/2)(V_{GS2} - V_{th})^2 \qquad (2)$$

When Eq. (1)–Eq. (2) is calculated, the following result is obtained.

$$\begin{aligned} I11 - I12 &= (k/2)(V_{GS1} + V_{GS2} - 2V_{th})(V_{GS1} - V_{GS2}) \\ &= (k/2)(V_{GS1} + V_{GS2} - 2V_{th})V_{in} \end{aligned} \qquad (3)$$

where VGS1 represents the gate-source voltage of the MOS transistor M1; VGS2 represents the gate-source voltage of the MOS transistor M2; and Vin represents the differential input voltage. Since it is assumed that input signals are fully-differential signals, when the mid-point voltage of the input signals is denoted by VB, the input voltages supplied to the input terminals are expressed by VB+Vin/2 and VB−Vin/2.

The source voltage VA of the differential transistor pair is calculated as follows.

$$V_{GS1} = V_B + V_{in}/2 - V_A$$

$$V_{GS2} = V_B - V_{in}/2 - V_A$$

Thus, assuming that $V_B - V_A - V_{th} = A$, by adding Eq. (1) +Eq. (2), $$\begin{aligned} (1) + (2) &= (A + V_{in}/2)^2 + (A - V_{in}/2)^2 \\ &= 2(I11 + I12)/k = 2I1/k \end{aligned} \qquad (4)$$

$$A = \sqrt{I1/k - V_{in}^2/4}$$

$$VA = VB - V_{th} - \sqrt{I1/k - V_{in}^2/4}$$

Thus, $$VGS1 = V_{in}/2 + V_{th}\sqrt{I1/k - V_{in}^2/4}$$

$$VGS2 = -V_{in}/2 + V_{th} + \sqrt{I1/k - V_{in}^2/4}$$

Substituting the above expressions into Eq. (3), the trans-conductance Gm1 [=(I11−I12)/Vin] can be obtained as follows.

$$\begin{aligned} Gm1 &= k(VGS1 + VGS2 - 2V_{th}) \\ &= k\sqrt{I1/k - V_{in}^2/4} \\ &= \sqrt{kI1/k^2 - V_{in}^2/4} \end{aligned} \qquad (5)$$

Likewise, the trans-conductance Gm2 [=(I21−I22)/Vin] of the second differential transistor circuit composed of the MOS transistors M3 and M4 and the current source I2 is obtained as follows.

$$Gm2 = \sqrt{kI2 - k^2 V_{in}^2/4} \qquad (6)$$

However, it is assumed that the parameter $k$ and the threshold voltage $V_{th}$ for the MOS transistors M3 and M4 are the same as those for the MOS transistors M1 and M2. Since the output signals with reverse polarities of the two differential transistor circuits are connected, the resultant transconductance Gm is obtained by the difference between Eq. (5) and Eq. (6).

$$Gm = \sqrt{kI1 - k^2 Vin^2/4} - \sqrt{kI2 - k^2 Vin^2/4} \qquad (7)$$

As is clear from Eq. (7), the trans-conductance Gm dynamically varies corresponding to an instantaneous amplitude value Vin of the input signals. In other words, the output signals have a distortion. Since the trans-conductance Gm includes a square term of the differential input voltage Vin, the distortion in the output signals is mainly a secondary distortion. With a load that is a linear device such as a resistor or a load that is an MOS transistor with a secondary characteristic, the secondary distortion cannot be canceled. In this case, the distortion of the waveform is very complicated. When a variable gain amplifier is structured with CMOS transistors, a large distortion inevitably takes place and thereby, the quality of the output signal deteriorates.

SUMMARY OF THE INVENTION

An object of the present invention is to accomplish a variable gain differential amplifier that is theoretically free of distortion and that is structured with an analog circuit composed of CMOS transistors.

To obtain the above-described object, the present invention is a variable gain amplifier that includes a pair of differential transistors that are a first field effect transistor and a second field effect transistor, input differential signals that are supplied to gate terminals of the first field effect transistor and the second field effect transistor, source terminals that are connected to a reference voltage, a differential current output means for causing a drain current of the first field effect transistor to branch to a constant voltage terminal and for outputting a current of which the drain current of the first field effect transistor and the drain current of the second field effect transistor are added as an output current, a first controlling means for controlling a DC voltage of the input differential signals, and a second controlling means for controlling the ratio of the amplitude of the output current to the amplitude of the input differential signals corresponding to the DC voltage varied by the first means.

With such a structure, since input signals are directly supplied as gate-source voltages of the CMOS differential transistor pair, the input signals are converted into a simple square current due to a square characteristic of the MOS transistors. The differential output signals are (DC+signal component)$^2$ and (DC−signal component)$^2$. Thus, when the difference is obtained by a current mirror or the like, "DC × signal component (primary component)" is obtained corresponding to a relevant mathematical formula. Consequently, the trans-conductance Gm (output current/input voltage) is proportional to only a DC voltage. Since the trans-conductance Gm is varied corresponding to the DC voltage, the gain can be varied with the trans-conductance Gm. In addition, the trans-conductance Gm does not depend on the instantaneous amplitude value Vin of the input signals. In other words, the trans-conductance Gm does not vary corresponding to the input signal. Thus, when the gain is varied, no distortion takes place.

These and other objects, features and advantages of the present invention will become more apparent in light of the following detailed description of a best mode embodiment thereof r as illustrated in the accompanying drawings.

DESCRIPTION OF PREFERRED EMBODIMENTS

Next, with reference to the accompanying drawings, embodiments of the present invention will be described.

Figure 1:
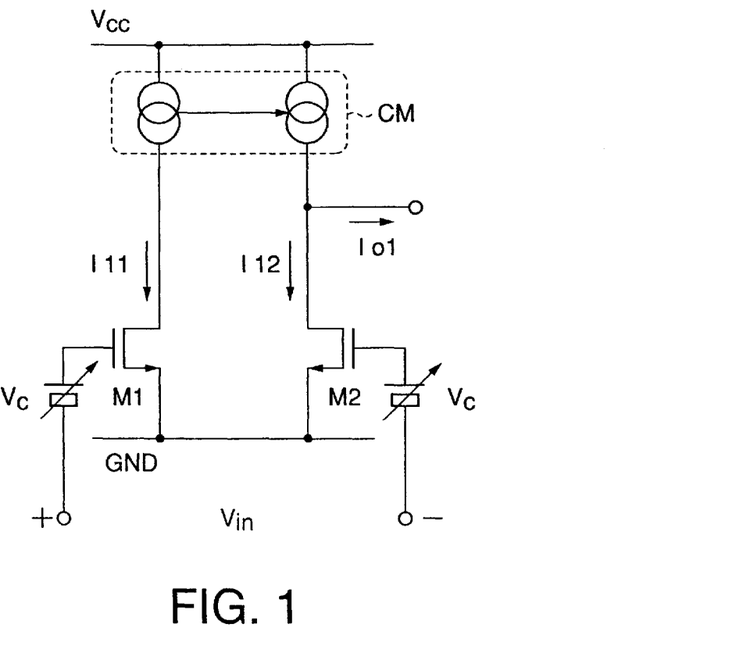
FIG. 1 is a circuit diagram for explaining a variable gain amplifier corresponding to a first embodiment of the present invention.

FIG. 1 is a circuit diagram for explaining a variable gain amplifier according to a first embodiment of the present invention. The variable gain amplifier shown in FIG. 1 is a source-ground type differential transistor circuit pair having MOS transistors M1 and M2. A DC voltage controlling means of the differential transistor circuit pair supplies input differential signals with a DC voltage Vc to gate terminals of the MOS transistors M1 and M2. A drain current I11 supplied from a voltage source Vcc to a drain of MOS transistor M1 is branched to a drain of the MOS transistor M2 by a current mirror CM. Thus, a difference current Io1 (=I11−I12) between the drain current I11 of the MOS transistor M1 and the drain current I12 of the MOS transistor M2 is supplied to the drain of the MOS transistor M2.

By controlling the DC voltage with such a circuit, the ratio of the output current Io1 to the amplitude of the input signals is controlled. In this embodiment, the differential transistors are composed of NMOS transistors. Alternatively, when the voltage source Vcc is substituted with the ground GND and the NMOS transistors are substituted with PMOS transistors, the operation of the resultant circuit is the same as that shown in FIG. 1. In the related art reference shown in FIG. 9, the source connection point of each differential transistor pair is biased with the current source. In contrast, in the present invention, the source connection point of each differential transistor pair is connected to a constant voltage (for example, GND in the embodiment shown in FIG. 1). In the circuit corresponding to the related art reference, as is clear from Eq. (4), which has a term of Vin2, secondary ripples take place at the source connection point of each NMOS differential transistor pair, resulting in a signal distortion. In contrast, in the circuit corresponding to the embodiment shown in FIG. 1, since the source connection point is connected to GND, the input signal voltage is directly applied between the source and gate of each NMOS differential transistor pair. Thus, the signal distortion is suppressed as will be described later.

To prove that no signal distortion takes place in the structure shown in FIG. 1, the trans-conductance of the differential transistor circuit shown in FIG. 1 will be calculated. As with the case of the related art reference shown in FIG. 9, it is assumed that input signals are fully-differential signals, that both the transistors operate in a saturation region (pinch-off region), that short channel effect is not considered, that parameter k and threshold voltage Vth of the MOS transistor M1 are the same as those of the MOS transistor M2, and that the parameter k is expressed by $\mu$ CoxW/L where W represents the gate width; L represents the gate length; Cox represents the gate capacitance; and $\mu$ represents the mobility of carriers on a relevant channel. Since the input signals are fully-differential signals, input voltages supplied to the input terminals are expressed as follows.

$$VGS1 = VB + Vc + Vin/2$$

$$VGS2 = VB + Vc - Vin/2$$

where VB represents the mid-point voltage of the input signals based on GND. Thus, the operations of the MOS transistors M1 and M2 are expressed as follows.

$$M1: \quad I11 = (k/2)(VGS1 - Vth)^2 \quad (8)$$
$$= (k/2)(VB + Vc - Vth + Vin/2)^2$$

$$M2: \quad I12 = (k/2)(VGS2 - Vth)^2 \quad (9)$$
$$= (k/2)(VB + Vc - Vth - Vin/2)^2$$

Thus, the output current Io1 is expressed as follows.

$$Io1 = I11 - I12 \quad (10)$$
$$= k(VB + Vc - Vth)Vin$$

where k represent the constant that depends on the shape of the MOS devices; and (VB+Vc-Vth) represents a DC voltage that can be controlled. Thus, the output current Io1 is directly proportional to the input amplitude Vin. In addition, a distortion component does not take place.

Consequently, in the embodiment shown in FIG. 1, an output waveform is theoretically free of distortion. The trans-conductance Gm (=Io1/Vin) of the differential transistor circuit in the embodiment is expressed as follows.

$$Gm = k(VB + Vc - Vth) \quad (11)$$

In the comparison between Eq. (7) for the conventional circuit and Eq. (11) for the circuit corresponding to the embodiment, it is clear that the distortion can be completely removed. The trans-conductance Gm can be easily controlled by varying the DC voltage Vc. When the DC voltage Vc is lowered until it is equal to -VB+Vth, the trans-conductance Gm becomes 0. Thus, since the gain (trans-conductance) can be controlled from infinitesimal, the control range thereof is wide. However, in this case, since the input dynamic range is small, it is not practical to lower the trans-conductance Gm to 0.

In addition, unlike the structure in which the source connection point of the differential transistors is biased with a current source, since the sources of the MOS transistors M1 and M2 that compose the differential transistor circuit are connected to GND, a wide dynamic range is obtained on the drain side. Thus, the resultant circuit is suitable for a low-voltage operation. In addition, since the sources of the MOS transistors M1 and M2 are connected to GND, even if the circuit is structured on a conventional P type substrate, the circuit is not affected by the body effect. Thus, an analog circuit with high accuracy and low distortion can be accomplished.

Figure 2:
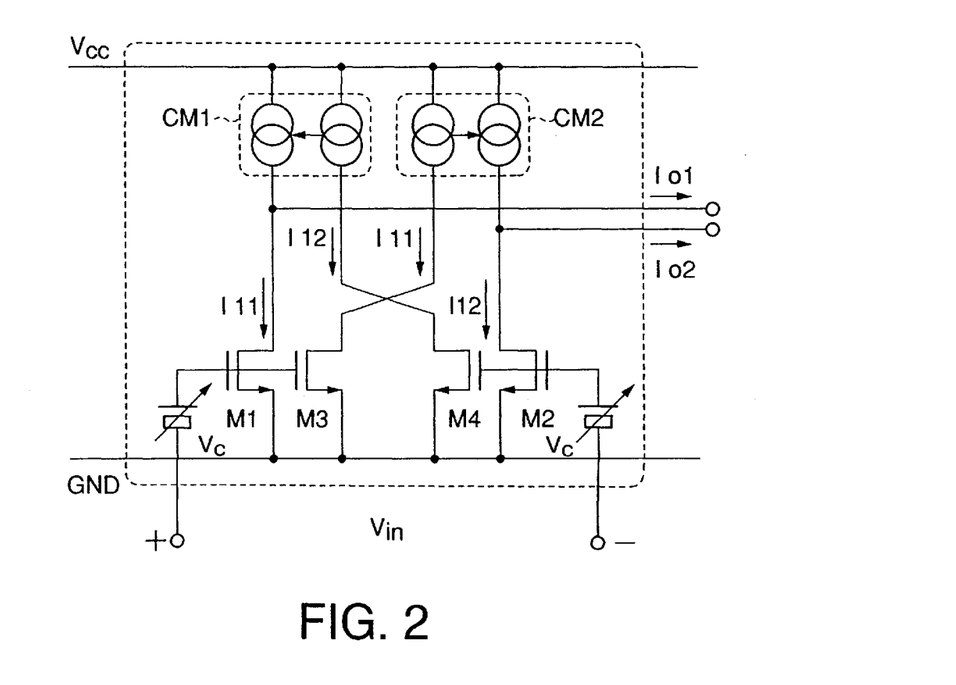
FIG. 2 is a circuit diagram for explaining a variable gain amplifier according to a second embodiment of the present invention.

FIG. 2 is a circuit diagram for explaining a variable gain amplifier according to a second embodiment of the present invention. The variable gain amplifier according to the second embodiment is composed of a first source-grounded type differential transistor circuit and a second source-grounded type differential transistor circuit. The first source-grounded type differential transistor circuit is composed of MOS transistors M3 and M2. The second source-grounded type differential transistor circuit is composed of MOS transistors M1 and M4. The structure of each of the first source-grounded type differential transistor circuit and the second source-grounded type differential transistor circuit is the same as the structure of the circuit shown in FIG. 1. Except for common input signals of the first source-grounded grounded type differential transistor circuit and second source-grounded type differential transistor circuit, since these circuits are independently structured, they operate in fully-differential. Since the orientation of the current mirror CM2 shown in FIG. 2 is the same as the orientation of the current mirror CM shown in FIG. 1, the MOS transistors M3 and M2 shown in FIG. 2 correspond to the MOS transistors M1 and M2 shown in FIG. 1, respectively. The output current Io2 shown in FIG. 2 is the same as the output current Io1 shown in FIG. 1. In other words, the output current Io2 shown in FIG. 2 is be expressed as follows.

$$Io2 = I11 - I12 \quad (12)$$
$$= k(VB + Vc - Vth)Vin$$

On the other hand, the orientation of the current mirror CM1 shown in FIG. 2 is the reverse of the orientation of the current mirror CM shown in FIG. 1. Since the MOS transistors M4 and M1 shown in FIG. 2 correspond to the MOS transistors M1 and M2 shown in FIG. 1, respectively, the polarity of the input differential signals to the output signals of the circuit shown in FIG. 2 is the reverse of that shown in FIG.

Thus, the output current Io1 shown in FIG. 2 is equal to -1 x Eq. (10). In other words, $$Io1 = I12 - I11 \quad (13)$$
$$= -k(VB + Vc - Vth)Vin$$

As described above, the two output terminals shown in FIG. 2 output fully-differential signals. Since the input signals shown in FIG. 2 are also fully-differential signals, with the circuit shown in FIG. 2 that is connected on many stages, the gain control range can be widened. With Eqs. (12) and (13), the trans-conductance Gm shown in FIG. 2 is expressed as follows.

$$Gm = (Io2 - Io1)/Vin \quad (14)$$
$$= 2k(VB + Vc - Vth)$$

In other words, the trans-conductance Gm of the circuit shown in FIG. 2 is twice as large as the trans-conductance Gm of the circuit shown in FIG. 1. As with the first embodiment, by controlling the DC voltage, the ratio of the output current Io2−Io1 to the amplitudes of the input signals can be controlled. In addition, even if NMOS transistors are substituted with PMOS transistors, the operation of the resultant circuit is the same as that shown in FIG. 1.

Figure 3:
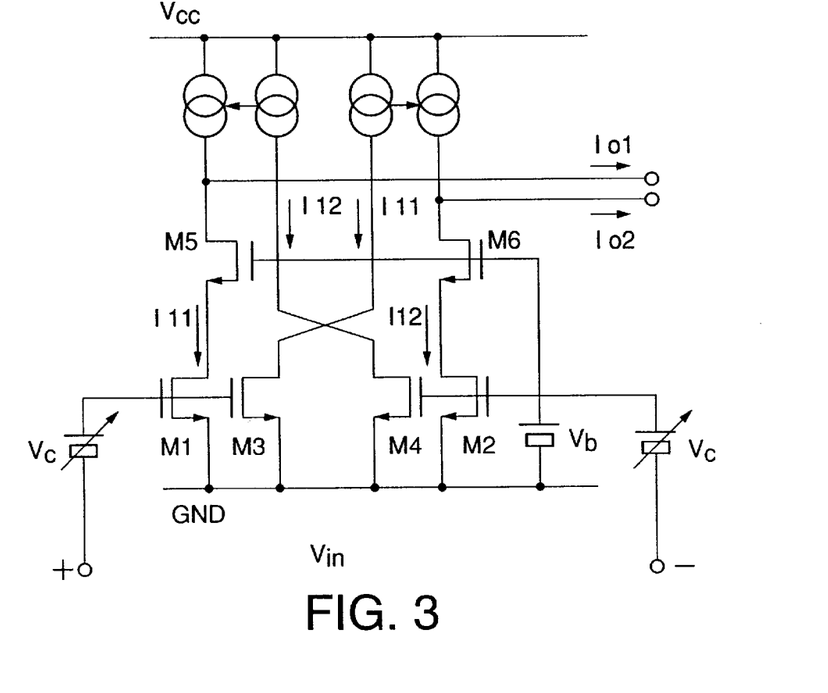
FIG. 3 is a circuit diagram for explaining a first modification of the second embodiment of the present invention.

The second embodiment of the present invention may have various modifications. FIG. 3 shows a modification of the second embodiment. In FIG. 3, MOS transistors M5 and M6 are disposed between the MOS transistors M1 and M2 and respective output terminals in such a manner that the gates of the MOS transistors M5 and M6 are connected to a constant voltage Vb. Thus, signals at the output terminals can be suppressed from leaking out to the input side through stray capacitances. Consequently, the frequency characteristic can be improved.

Figure 4:
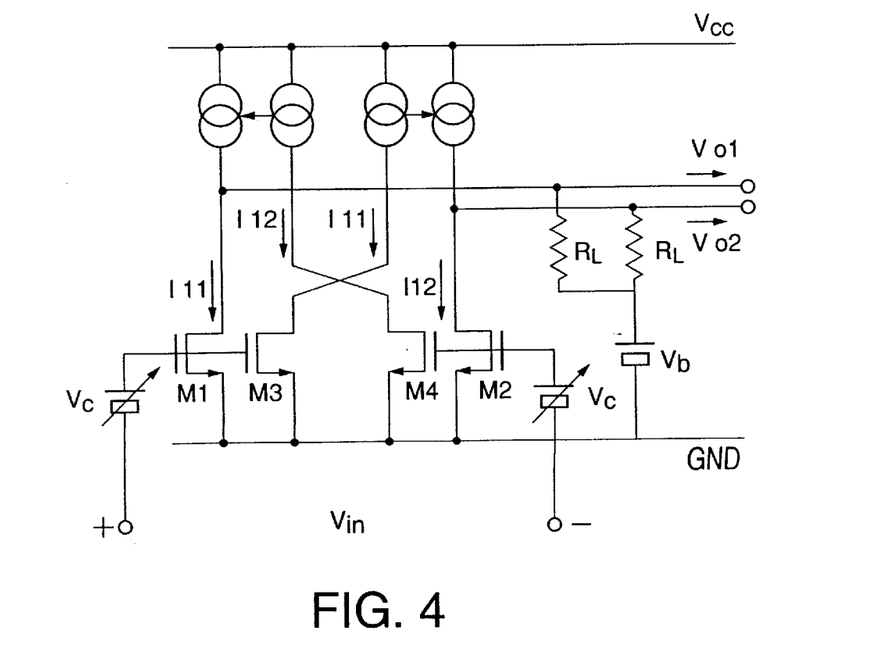
FIG. 4 is a circuit diagram for explaining a second modification of the second embodiment of the present invention.

FIG. 4 shows another modification of the second embodiment of the present invention. In FIG. 4, two resistors RL and a constant voltage source Vb are disposed in the circuit shown in FIG. 2 so that the first register RL and the constant voltage source Vb are connected in serial between the first output terminal and GND and the second register RL is connected between the second output terminal and the connection point of the first resistor RL and the constant voltage source Vb. In this structure, the first and second registers RL are used as load resistors. It should be noted that the modifications shown in FIGS. 3 and 4 can be applied to the circuit shown in FIG. 1 as well as the circuit: shown in FIG. 2.

Figure 5:
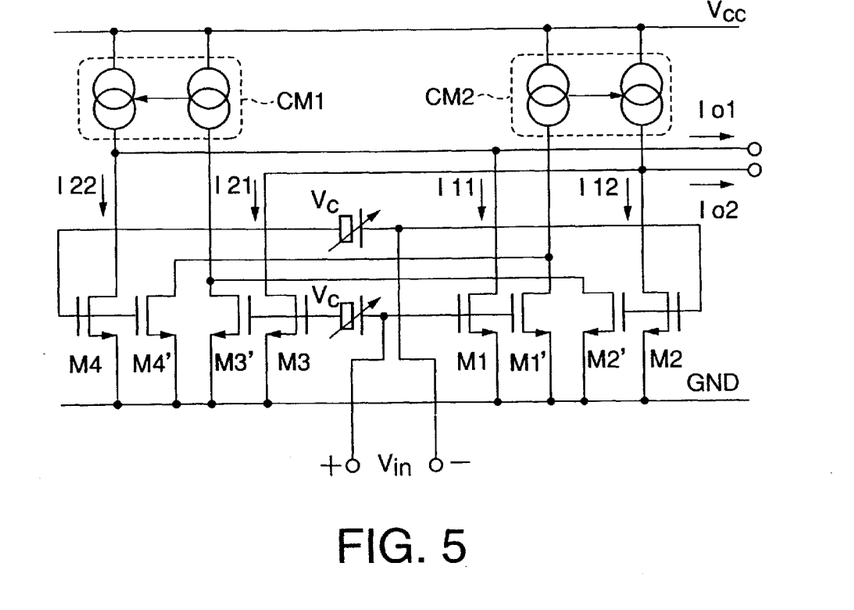
FIG. 5 is a circuit diagram for explaining a variable gain amplifier according to a third embodiment of the present invention.

Next, with reference to FIG. 5, a third embodiment of the present invention will be described. The circuit shown in FIG. 5 is structured with two sets of the circuit composed of MOS transistors M1 to M4 (shown in FIG. 2). In other words, the circuit shown in FIG. 5 is composed of a right side circuit portion and a left side circuit portion. The right side circuit portion is composed of MOS transistors M1, M1', M2, and M2'. The left side circuit portion is composed of MOS transistors M3, M3', M4, and M4'. In these circuits, output currents with the same polarities are connected and combined output currents are obtained.

In FIG. 5, the current mirror between the MOS transistors M2' and M1 and the current mirror between the M3' and M4 are combined as a current mirror CM1. In addition, the current mirror between the MOS transistors M1' and M2 and the current mirror between the MOS transistors M4 and M3 are combined as a current mirror CM2. The input signal and DC offset of the right side circuit portion are the same as those of the left side circuit portion. Next, the output currents Io1 and Io2 and the trans-conductance Gm shown in FIG. 5 will be calculated. It is assumed that conditions in the circuit shown in FIG. 5 are the same as those in FIG. 1. Assuming that the input signals are fully-differential signals and that the mid-point voltage of input signals based on GND is denoted by VB, the input voltages supplied to the input terminals are expressed as follows.

VGS1=VB+Vin/2

VGS2=VB−Vin/2

Thus, the operations of the MOS transistors M1 to M4 are expressed as follows.

$$M1: \ I11 = (k/2)(VGS1 - Vth)^2 \quad (15)$$
$$= (k/2)(VB - Vth + Vin/2)^2$$

$$M2: \ I12 = (k/2)(VGS2 - Vth)^2 \quad (16)$$
$$= (k/2)(VB - Vth - Vin/2)^2$$

$$M3: \ I21 = (k/2)(VGS3 - Vth)^2 \quad (17)$$
$$= (k/2)(VB - Vc - Vth + Vin/2)^2$$

$$M4: \ I22 = (k/2)(VGS4 - Vth)^2 \quad (18)$$
$$= (k/2)(VB - Vc - Vth - Vin/2)^2$$

Thus, the output currents Io1 and Io2 can be expressed as follows.

$$Io1 = (I12 + I21) - (I11 + I22) \quad (19)$$
$$= (I21 - I22) - (I11 - I12)$$
$$= (k/2)\{2(VB - Vc - Vth)Vin - 2(VB - Vth)Vin\}$$
$$= -kVcVin$$

$$Io2 = (I11 + I22) - (I12 + I21) \quad (20)$$
$$= (I11 - I12) - (I21 - I22)$$
$$= (k/2)\{2(VB - Vth)Vin - 2(VB - Vc - Vth)Vin\}$$
$$= kVcVin$$

where k represents a constant that depends on the shape of MOS devices; and Vc represents a DC control voltage. Thus, the output currents Io1 and Io2 are directly proportional to the input amplitude Vin and do not have a distortion component.

Consequently, in the circuit according to the embodiment shown in FIG. 5, a single output current does not have a distortion waveform. In addition, differential output currents are completely symmetrical and free of a distortion. The trans-conductance Gm [=(Io2−Io1)/Vin] of the circuit is expressed as follows.

$$Gm=2kVc \quad (21)$$

Since Eq. (21) does not include a term of Vin, as with the first embodiment, it is clear that a distortion can be completely removed. By varying the DC control voltage Vc, the trans-conductance Gm can be easily controlled. When the DC control voltage Vc is lowered to 0, the trans-conductance Gm becomes 0.

Thus, since the gain (trans-conductance) can be controlled from infinitesimal, the control range is wide. In this case, since the DC control voltage Vc can be designated regardless of the mid-point voltage VB, an adequate input dynamic range can be secured with a proper value of the midpoint voltage VB. Thus, as described in the first embodiment, even if the trans-conductance Gm is lowered, the input dynamic range is not adversely affected. Consequently, a good characteristic can be maintained. In addition, since the trans-conductance Gm is expressed by only the constant k and the DC control voltage rather than other device parameters such as the threshold voltage Vth, a variable gain. circuit that has a low sensitivity against deviation of process parameters and high accuracy can be structured. In addition, as with the first embodiment, since a single output current is free of a distortion, even if the circuit is connected on many stages, the output signal is also free of a distortion. In addition, the circuit operates at a low voltage. Moreover, the circuit is not affected by body effect.

Figure 6:
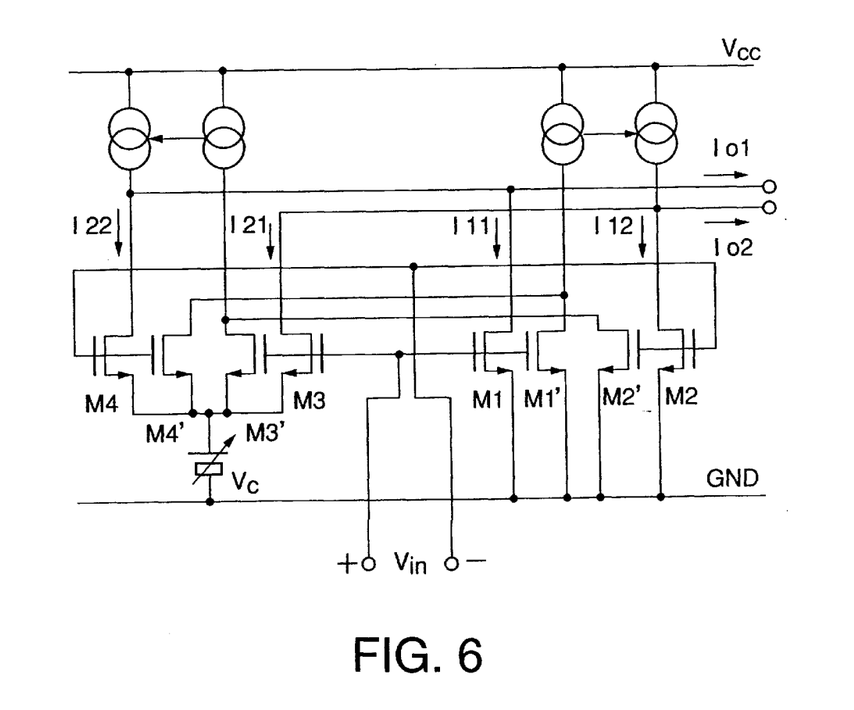
FIG. 6 is a circuit diagram for explaining a modification of the third embodiment of the present invention.

Next, with reference to FIG. 6, a modification of the third embodiment will be described. In the circuit shown in FIG. 5, the DC offset Vc that is supplied to the gates of the differential transistor pairs M3-M4 and M3'-M4' of the left side circuit portion of the circuit. In the circuit shown in FIG. 6, the DC offset Vc is supplied to the sources of the differential transistor pairs.

The variable gain of the circuit shown in FIG. 5 is accomplished in such a manner that the DC gate-source voltage of the differential transistor pair of the right side circuit portion is different from the DC gate-source voltage of the differential transistor pair of the left side circuit portion. Thus, since the difference between the circuit shown in FIG. 6 and the circuit shown in FIG. 5 is whether the DC offset voltage Vc is applied to the sources or to the gates, the relation of gate-source of the right side circuit portion and the left side circuit portion of the circuit shown in FIG. 6 is the same as that shown in FIG. 5. Thus, it is clear that the operation of the circuit shown in FIG. 6 is the same as the operation of the circuit shown in FIG. 5.

Figure 7:
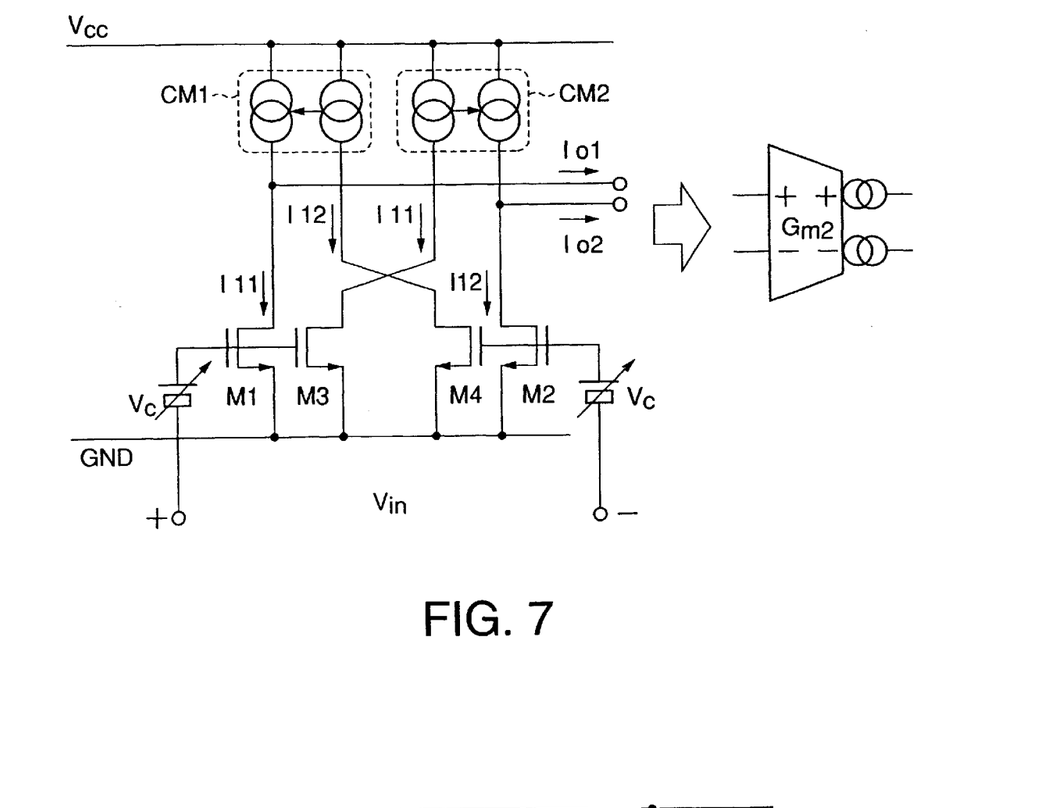
FIG. 7 shows the circuit diagram of FIG. 2 and a symbol thereof.
Figure 8:
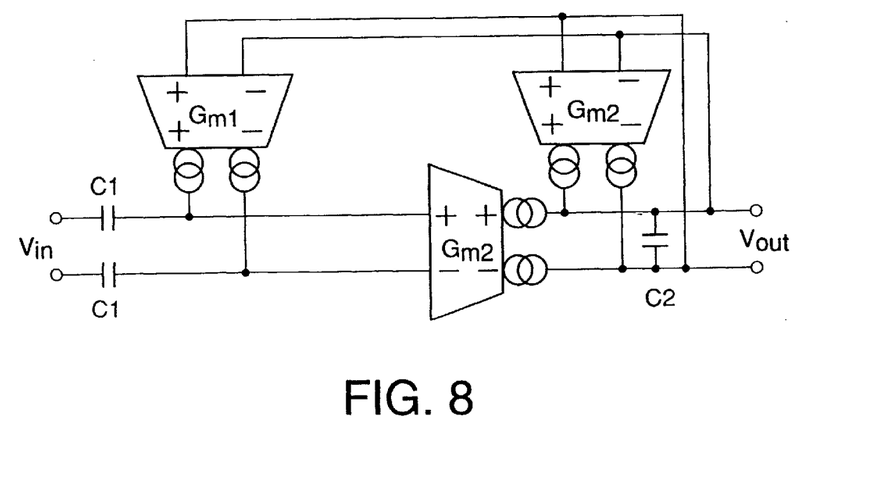
FIG. 8 is a schematic diagram for explaining an application of a variable gain amplifier according to the present invention to a filter.

FIGS. 7 and 8 are circuit diagrams for explaining a filter circuit to which the circuit according to the second embodiment shown in FIG. 2 is applied. In this case, capacitors are added to the circuit shown in FIG. 2 so as to form a filter circuit whose frequency characteristic can be adjusted. The circuit of the left portion in FIG. 7 is the same as the circuit shown in FIG. 2. The circuit of the left portion in FIG. 7 is equivalent to a symbol of the right portion of FIG. 7. By combining the circuit shown in FIG. 7 and capacitors, a secondary band pass filter is structured.

Each trans-conductance Gm of the circuit shown in FIG. 8 has a fully linear characteristic. In addition, since each capacitor shown in FIG. 8 is a linear device, the filter outputs signals that are free of a distortion. When the DC offset voltage Vc is varied, each trans-conductance Gm can be controlled. Thus, the frequency characteristic can be controlled in proportion to the freqeunce axis. Consequently, the deviation of a filter characteristic (such as time constant) due to fabrication fluctuation of semiconductor devices can be compensated.

In addition, with the circuit shown in FIG. 1 or the circuit shown in FIG. 5, a filter circuit can be structured.

In the first to third embodiments and modifications thereof, the structures using NMOS transistors were described. However, when NMOS transistors are substituted with PMOS transistors and Vcc is substituted with GND, PMOS type variable gain difference amplifiers can be structured.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A variable gain amplifier, comprising:
    a pair of differential transistors that are first field effect transistor and a second field effect transistor, input differential signals being supplied to gate terminals of the first field effect transistor and the second field effect transistor, source terminals being connected to a reference voltage;
    differential current output means for causing a drain current of the first field effect transistor to branch to a constant voltage terminal and for outputting a current of which the drain current of the first field effect transistor and the drain current of the second field effect transistor are added as an output current;
    controlling means for controlling a DC voltage of the input differential signals.

2. The variable gain amplifier as set forth in claim 1, wherein said differential current outputting means is a current mirror circuit composed of field effect transistors with a conduction type that is different from that of the field effect transistors of the pair of differential transistors.

3. The variable gain amplifier as set forth in claim 1, wherein a voltage generated at a resistor to which the output current is supplied is output.

4. A variable gain amplifier, comprising:
    two sets of differential transistor pairs having differential current outputting means, each set of differential transistor pair having a first field effect transistor and a second field transistor, input differential signals being supplied to gate terminals of the first field effect transistor and the second field effect transistor, source terminals being connected to a reference voltage, the differential current outputting means causing a drain current of the first field effect transistor to branch to a constant voltage terminal and for outputting a current of which the drain current of the first field effect transistor and the drain current of the second field effect transistor are added as an output current,
    wherein one of the input differential signals is supplied to a first field effect transistor of said first differential transistor pair and a second field effect transistor of said second differential transistor pair,
    wherein the other input differential signal is supplied to a second field effect transistor of said first differential transistor pair and a first field effect transistor of said second differential transistor pair, and
    wherein a differential output current of said first differential transistor pair and a differential output current of said second differential transistor pair are output as a pair of differential output signals that are fully-differential output signals controlling means for controlling a DC voltage of the input differential signals controlling means for controlling a DC voltage of the input differential signals.

5. A variable gain amplifier, comprising:
    a first fully-differential variable gain amplifier and a second fully-differential variable gain amplifier, each of which comprises two sets of differential transistor pairs having differential current outputting means, each set of differential transistor pair having a first field effect transistor and a second field transistor, input differential signals being supplied to gate terminals of the first field effect transistor and the second field effect transistor, source terminals being connected to a reference voltage, the differential current outputting means causing a drain current of the first field effect transistor to branch to a constant voltage terminal and for outputting a current of which the drain current of the first field effect transistor and the drain current of the second field effect transistor are added as an output current, wherein one of the input differential signals is supplied to a first field effect transistor of the first differential transistor pair and a second field effect transistor of the second differential transistor pair, wherein the other input differential signal is supplied to a second field effect transistor of the first differential transistor pair and a first field effect transistor of the second differential transistor pair, and wherein a differential output current of the first differential transistor pair and a differential output current of the second differential transistor pair are output as a pair of differential output signals that are fully-differential output signals, wherein an input differential signal is supplied with a relative DC offset to said first fully-differential variable gain amplifier and said second fully-differential variable gain amplifier, wherein a first differential output signal of said first fully-differential variable gain amplifier and a second differential output signal of said second fully-differential variable gain amplifier are added and supplied as a combined differential output, the polarity of the first differential output signal being different from the polarity of the second differential output signal, and wherein the relative DC offset is varied so as to control the ratio of the amplitude of the combined differential output signal to the amplitude of the input signals controlling means for controlling a DC voltage of the input differential signals.

6. The variable gain amplifier as set forth in claim 5, wherein a first reference voltage at source terminals of the first differential transistor pair and the second differential transistor pair of said first fully-differential variable gain amplifier is in common with a second reference voltage at source terminals of the first differential transistor pair and said second differential transistor pair of said second fully-differential variable gain amplifier, and wherein a DC offset for controlling a gain is applied between an input differential voltage at gate terminals of the first differential transistor pair and the second differential transistor pair of said first fully-differential variable gain amplifier and an input differential voltage at gate terminals of the first differential transistor pair and the second transistor pair of said second fully-differential variable gain amplifier.

7. The variable gain amplifier as set forth in claim 5, wherein a DC offset for controlling a gain is applied between a first reference voltage at source terminals of the first differential transistor pair and the second differential transistor pair of said first fully-differential variable gain amplifier and a second reference voltage at source terminals of the first differential transistor pair and the second transistor pair of said second fully-differential variable gain amplifier, and wherein an input differential voltage at gate terminals of the first differential transistor pair and the second differential transistor pair of said first fully-differential variable gain amplifier is in common with an input differential voltage at gate terminals of the first differential transistor pair and said second differential transistor pair of said second fully-differential variable gain amplifier.

8. The variable gain amplifier as set forth in claim 1, 4, or 5, wherein capacitors as loads are connected to output terminals of the output currents so as to form integrators, and wherein a filter circuit is composed of two or more integrators, the frequency characteristic of the filter circuit being controlled by varying the DC voltage or DC offset.

* * * * *